United States Patent
Bores et al.

(10) Patent No.: US 6,945,405 B1
(45) Date of Patent: Sep. 20, 2005

(54) TRANSPORT MODULE WITH LATCHING DOOR

(75) Inventors: Gregory Bores, Prior Lake, MN (US); Michael C. Zabka, Eagan, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/088,237

(22) PCT Filed: Jul. 6, 2000

(86) PCT No.: PCT/US00/18511

§ 371 (c)(1),
(2), (4) Date: Mar. 18, 2002

(87) PCT Pub. No.: WO01/04022

PCT Pub. Date: Jan. 18, 2001

Related U.S. Application Data (60) Provisional application No. 60/142,831, filed on Jul. 8, 1999.

(51) Int. Cl.[7] .............................................. B65D 85/90
(52) U.S. Cl. ........................... 206/711; 70/63; 206/454; 414/217.1
(58) Field of Search ........................... 70/63; 206/454, 206/710, 711; 211/41.18; 414/217, 217.1, 414/292, 416

(56) References Cited

U.S. PATENT DOCUMENTS

| 5,173,273 | A |   | 12/1992 | Brewer |
| 5,711,427 | A |   | 1/1998  | Nyseth |
| 5,915,562 | A |   | 6/1999  | Nyseth et al. |
| 5,957,292 | A | * | 9/1999  | Mikkelsen et al. ......... 206/710 |
| 5,988,392 | A |   | 11/1999 | Hosoi |
| 6,098,809 | A | * | 8/2000  | Okada et al. ................ 206/711 |

* cited by examiner

*Primary Examiner*—Jim Foster
(74) *Attorney, Agent, or Firm*—Patterson, Thuente, Skaar & Christensen, P.A.

(57) ABSTRACT

A wafer container has an open front defined by a frame for receiving a door. The frame has slots on opposite sides. The door utilizes two latching linkages that extend, lift, lower and retract two latching portions from the edge portion of each opposite side of the door and into and out of latch receptacles on the frame. Each latching mechanism utilizes a sliding plate with a handle connected thereto and exposed on the front of the door. The sliding plate has a pair of lifting linkages cooperating with a pair of latching linkages. Moving the handles outwardly extends the latching portions into the latching receptacles, then pulls the door inwardly to seal the door to the container portion. The sliding plate includes a rack portion engaged with a pinion accessible from the front of the door by a latch key whereby the mechanism can be operated robotically.

21 Claims, 8 Drawing Sheets

TRANSPORT MODULE WITH LATCHING DOOR

This application claims the benefit of provisional application No. 60/142,831 filed Jul. 8, 1999.

BACKGROUND OF THE INVENTION

This invention relates to wafer carriers. More particularly it relates to sealable wafer enclosures having doors with latching mechanisms.

Various methods have been utilized for enclosing wafers in containers. For such storage and shopping some containers have rigid bodies with vertical slots for receiving the wafers and with flexible snap-on covers. These containers are generally not suitable for use in applications where the wafers are not to be exposed to the ambient atmosphere.

Figure 1:
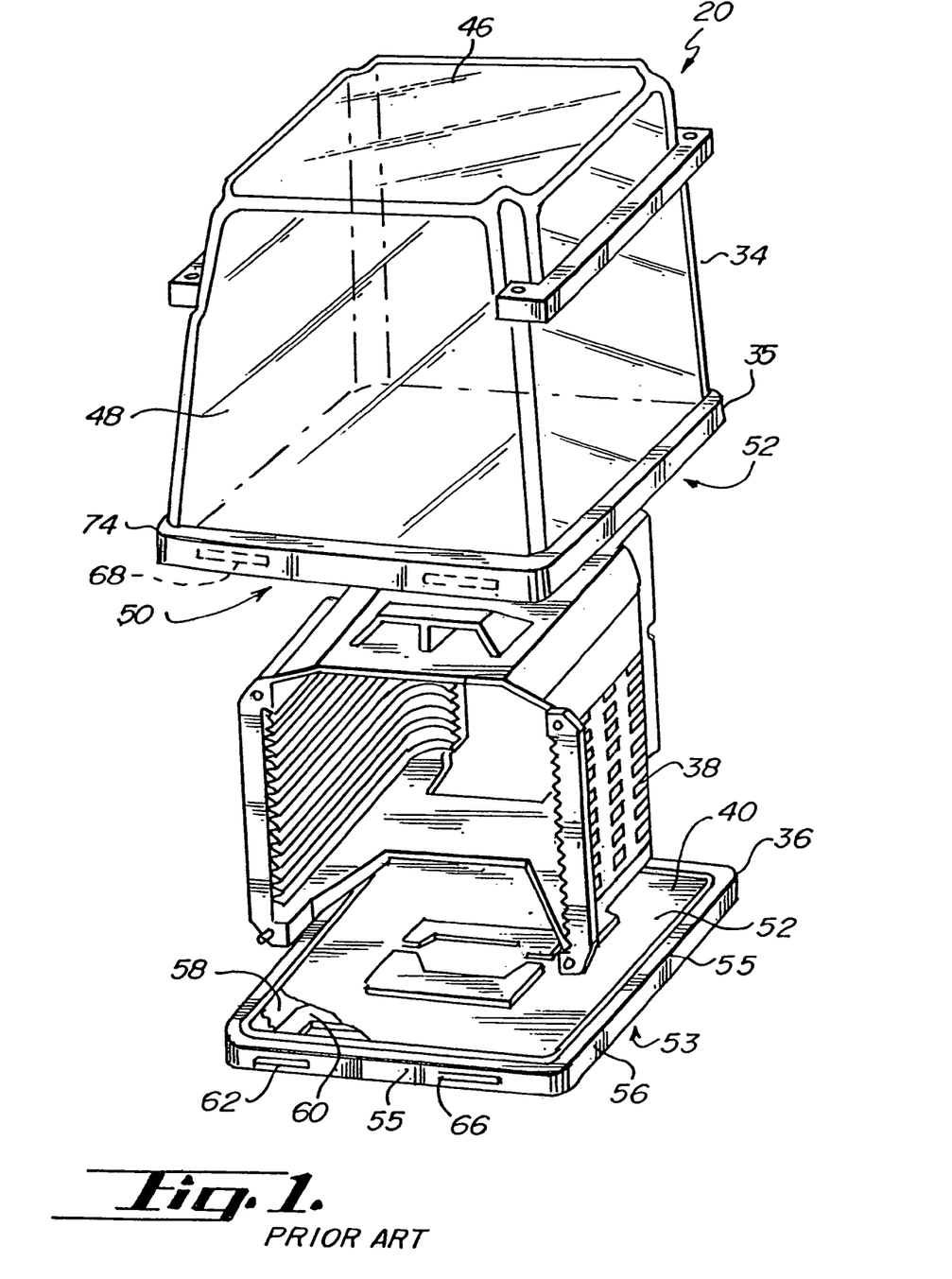
FIG. 1 is a perspective view of a prior art SMIF pod.

For wafers in the range of 200 mm and smaller, containers known as SMIF (standardized mechanical interface) pods 20 such as shown in FIG. 1, have been utilized to provide a clean sealed mini-environment that allows transfer of wafers into processing equipment without exposing the wafers to the ambient atmosphere. Examples of these pods are shown in U.S. Pat. Nos. 4,532,970 and 4,534,389. Such SMIF pods typically utilize a transparent container portion 34 with a lower door frame portion 35 configured as a flange defining an open bottom 52 and a latchable door 36 that closes the open bottom. The door frame portion 35 clamps onto processing equipment and a door on the processing equipment attaches to the lower SMIF pod door. Both doors may be simultaneously lowered downwardly from the shell into a sealed processing environment in said processing equipment. A separate H-bar carrier 38 positioned on the top surface 40 of the SMIF pod door 36 and loaded with wafers is lowered with the pod door for accessing and processing said wafers.

Figure 2:
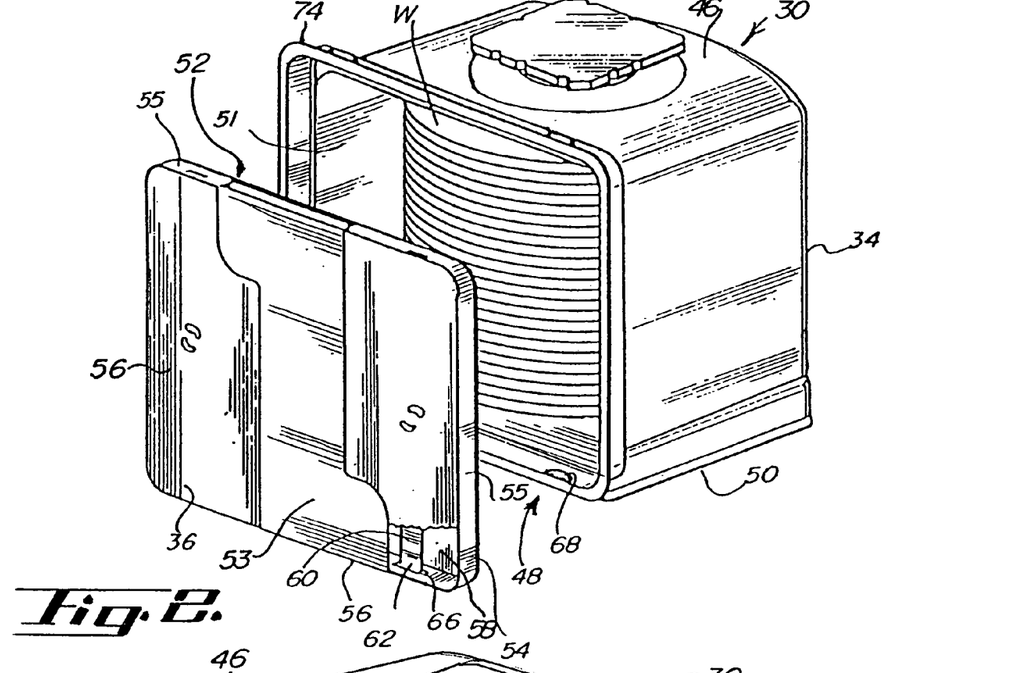
FIG. 2 is a perspective view of a prior art transport module.

The semiconductor processing industry has moved toward utilization of larger wafers, specifically 300 mm wafers. Transport modules for such wafers, by way of developing industry standards, utilize a front opening door that drops downwardly from the module. Referring to FIG. 2 such a front opening enclosure is shown. Such an enclosure has analogous components within the container portion 34 without a separate removable carrier.

Conventional configurations of door enclosures and latching mechanisms for sealable enclosures are known in the art. Generally, these typically have the disadvantage that they are not easily disassembled, they have numerous moving parts, and they utilize metallic parts including fasteners. The use of metallic fasteners or other metal parts is highly undesirable in semiconductor wafer carriers or containers. Metallic parts generate highly damaging particulates when rubbed or scrapped. Assembly of a module with fasteners causes such rubbing and scrapping. Thus, the use of metal fasteners or other metal parts in wafer enclosures is to be avoided.

Although enclosures as described above are utilized in relatively clean environments, such enclosures will over time accumulate contaminants on the enclosure, in the enclosure, and in the interior of the door enclosure ultimately requiring cleaning. Such contaminants may be created by the rubbing of parts such as the operation of the door latching mechanism as described above, by the wafers being loaded and unloaded on the wafer shelves, and by the door being engaged and disengaged with the container portion. The numerous parts in conventional latching mechanisms, the difficulty of disassembly of the doors, and the use of metallic fasteners make the cleaning of such doors difficult. Easily disassembleable doors, with easily disassembleable latching mechanisms, and with minimal moving parts are highly desirable.

The larger doors required for larger wafer carriers require secure latching mechanisms in the doors. Ideally, such mechanisms will be mechanically simple with few moving parts and no metal parts.

Recently front opening transport modules have been developed that satisfies many of the above requirements. See, for example, U.S. Pat. No. 5,915,562 to Nyseth and Krampotich and assigned to the owner of the invention of this application. Also see Ser. No. 08/904,660, in which the issue fee has been paid, to Eggum, Wiseman, Mikkelsen, Adams, and Bores, also assigned to the owner of the invention of the instant application. The '562 patent and allowed 08/904,660 application are incorporated by reference herein. These latching mechanisms, as well as the other wafer carrier latching mechanisms known in the art, will typically use rotatable cammed members. These cammed members have typically been formed of generally circular plastic plates with elongate recesses defining cam surfaces.

In prior art carriers such latching mechanisms were enclosed within door enclosures. Such enclosures generally will isolate and contain any particle generation created by the latching mechanism. Such particles can accumulate and eventually need removal and cleaning. Traditionally, wafer carriers including wafer containers are cleaned with water solutions and dried with pressurized air or gases. Such cleaning is critical in keeping yields up. In order to effectively accomplish cleaning, the doors need to be disassembled or at least have covers removed exposing the latching mechanisms. This process is labor intensive and tedious. To the extent the cover is not removed, access and cleaning of the interior is difficult. Also if washing is accomplished with the latching mechanism enclosed, drying of the enclosed latching mechanism is problematic.

The rotatable cammed members are particularly useful in conforming with the industry standards for robotically opening the 300 mm carrier doors. See SEMI E62, Provisional Specification for FIMS Door, available from the Semiconductor Equipment Manufacturers Institute, Mountain View, Calif., and attached as an Appendix. These standard requires the use of two parallel spaced tools, termed "latch keys" which are robotically inserted into a door. Both tools are simultaneously rotated clockwise to unlatch the door. Consistent with these standards, conventional front opening transport modules or shippers for 300 mm wafers utilize two separate latching mechanisms, one for each side of the door.

Such mechanisms that are also manually openable, utilize handles that also turn the internal cammed member. Traditional 300 mm shippers that have such manual handles require each of two such handles to be separately rotated and then the door is manually removed by pulling on the manual handles. Such separate rotational movement by each hand of an operator in non symmetrical, awkward, and generally counterintuitive. Additionally it is difficult to ascertain if each rotational handle has been turned the full necessary rotation for full latching or unlatching.

Although such rotating cammed members function in wafer carrier doors, they have several deficiencies. The rotatable cammed member can be difficult to design and fabricate and they typically require relatively large circular cammed members for reasonable mechanical advantage. Reducing the size of such cammed members reduces the mechanical advantage. Moreover cammed members do not typically have smooth operation when translating the rotational motion to a linear motion that is irregular as is appropriate in latching and unlatching applications. Particularly, when manually rotating such rotating cammed members, false stops may occur before the latch portions are fully extended or retracted.

Moreover, such cammed rotatable members are inimical to providing a supplemental non-rotational manual grasping latching/unlatching handle. Providing rotating supplemental manual handles are known. However, such handles that rotate provide a very insecure handling means which can lead to non-smooth cumbersome manual placement and removal of doors from the door openings of the enclosure portions. Such non-smooth operation can lead to inadvertent contact between the door and enclosure at the door opening causing scrapping with particle generation, disruption of seating of the wafers, particle launching from the carrier, or other undesirable consequences. A wafer door with a latching mechanism would ideally have grasping handles that manually operate the latching mechanism that are non-rotating.

A manually operated door that is smoothly, easily and intuitively operated and that has a simple mechanical design is needed. Moreover, such a door is needed that complies with the industry standards for robotic operation of the door.

SUMMARY OF THE INVENTION

A wafer container has an open front defined by a door receiving frame and a door sized for the door receiving frame. The door receiving frame has slots on opposite sides and the door and utilizes two latching linkages that extend, lift, lower and retract two latching portions from the edge portion of each opposite side of the door and into and out of latch receptacles on the door receiving frame. In a preferred embodiment, each latching mechanism utilizes a sliding plate with a handle connected thereto and exposed on the front of the door. The sliding plate has a pair of lifting linkages cooperating with a pair of latching linkages. Moving the handles outwardly first extends the latching portions in a first direction into the latching receptacles and then by way of a ramped cam surface and cam follower surface on the overlapping linkages, the latching portions move in a second direction normal to the first direction to pull the door inwardly and to seal the door to the container portion. The sliding plate includes a rack portion engaged with a pinion. The pinion is accessible from the front of the door by a latch key whereby the mechanism can be operated robotically. Thus a latch mechanism is provided with a non-rotating grasping handle that provides a secondary means for operating the latch. In a preferred embodiment the entire latching mechanism is exposed on the front of the door.

An object and advantage of preferred embodiments of the invention is that a non-rotational means is provided to operate the latching mechanism.

An object and advantage of preferred embodiments is that the latching mechanism is exposed on the front of the front door facilitating cleaning and drying of the mechanism, visually assuring proper operation, and generally providing easy access to the mechanism if maintenance is needed.

An object and advantage of preferred embodiments of the invention is that there are no door enclosures. This minimizes the number of components, simplifies assembly, and reduces cost.

An object and advantage of preferred embodiments of the invention is that the manual motion to latch the door is intuitive, that is, moving the handles outwardly toward the periphery of the door extends the latch portions. Moving the handles inwardly retracts the latch portions.

A further object and advantage of preferred embodiments of the invention is that the manually operable latch mechanism of the door is also robotically operable.

A feature and advantage of preferred embodiments of the invention is that the latching mechanism operates smoothly particularly when compared to mechanisms utilizing rotating cammed members.

An advantage and feature of the invention is that the latching mechanism utilized is comprised of a minimal member of component parts that are mechanically simply yet provide an effective and reliable latching action.

Another feature and advantage of the invention is that the mechanism is positioned in the interior of the door thereby minimizing the generation and dispersal of particles by the door mechanism.

When used herein "substantially" includes the quantity, quality, or position exactly as indicated. "Connected" and variation thereof do not require direct connection or contact and the elements connected may be linked by way of mechanisms or couplings.

DETAILED SPECIFICATION

Prior art FIGS. 1 and 2 show a bottom opening SMIF pods 20 and a front opening transport module 30 respectively for which the invention is highly suitable. Each sealable enclosure has a container portion 34 and a cooperating door 36. The SMIF pod 20 also has a separate wafer carrier 38 which is a H-bar carrier, well known in the art, which seats on the top surface 40 of the door 36.

Each container portion 34 and each enclosure has a top side 46, a front side 48, and a bottom side 50. In the SMIF pod the bottom side 50 is open for receiving the wafer carrier 38 and the door 36.

The doors have an inwardly facing side 52, an outwardly facing side 53, and a periphery 55 comprise an enclosure 56 with an open interior 58 which contains a latching mechanism 60, a portion of which is shown in FIGS. 1 and 2. The latching mechanism includes a latching portion 62 which is extendable out of slots 66 to engage into latching portion receivers 68 located in the door frame portion 74 of the container portion 34.

Figure 3:
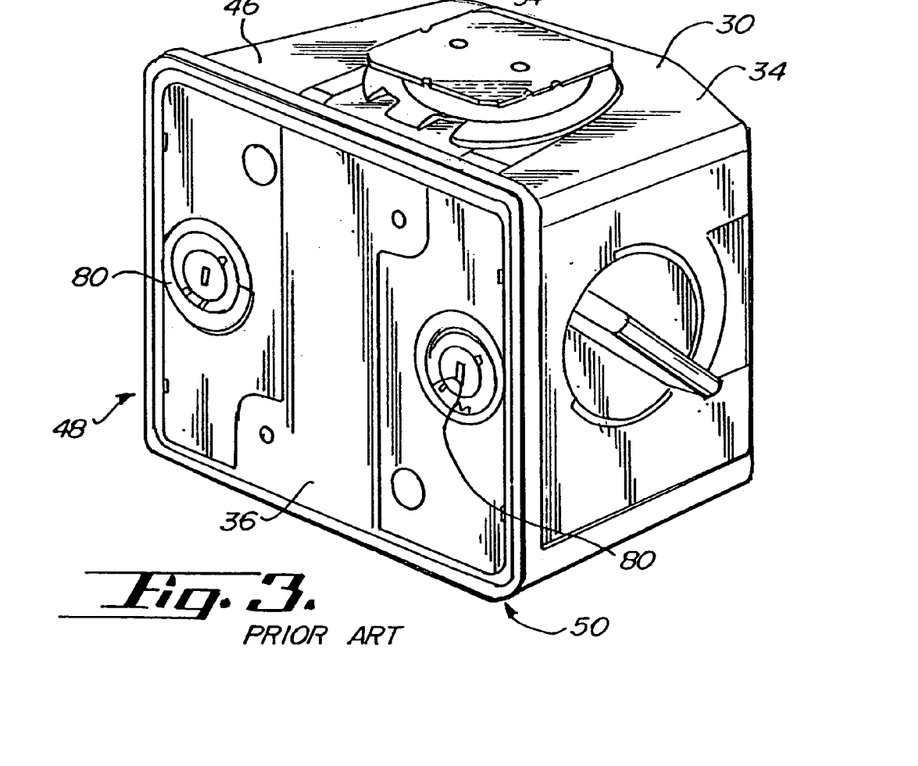
FIG. 3 is a perspective view of a prior art transport module with handles for manual operation and openings for robotic latch keys.

Referring to FIG. 3 prior art wafer container is shown which illustrates handles 80 which may be swung outwardly to facilitate rotation of same. Said handles are coupled to a rotatable cammed members in each respective door enclosure.

Figure 4:
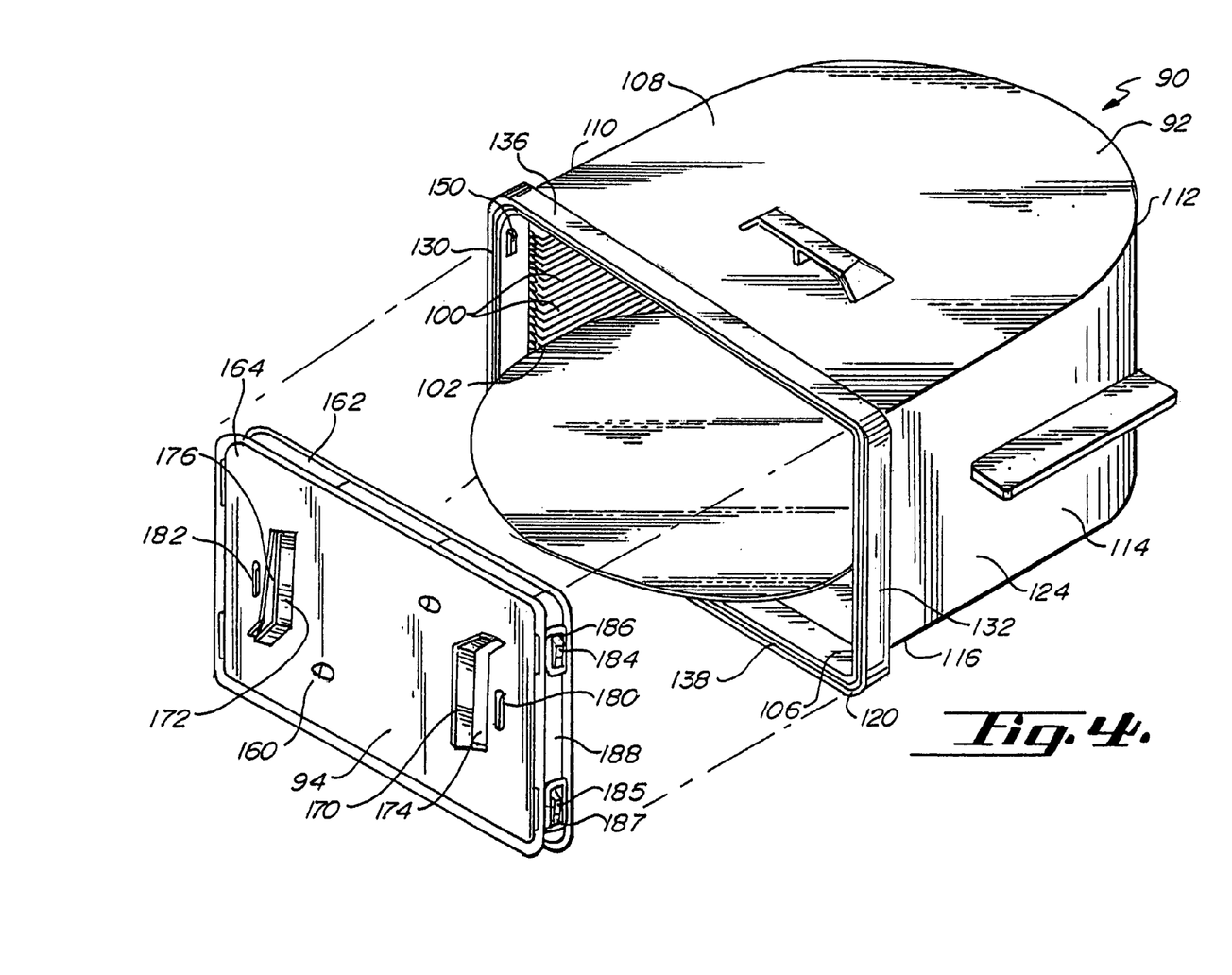
FIG. 4 is a perspective view of a wafer container in accordance with the invention herein.

Referring to FIG. 4, a wafer container 90 incorporating the invention is illustrated and generally comprises a container portion 92 and a cooperating door 94. The container portion has a plurality of wafer slots 100 for insertion and removal of wafers W in substantially horizontal planes. The slots are defined by the wafer support shelves 102. The container portion generally has an open front 106, a closed top 108, a closed left side 110, a closed back side 112, a closed right side 114, and a closed bottom 116. The container will typically have an equipment interfaces, not shown, on the outside of the closed bottom.

The door 94 seats into and engages with a door receiving frame 120 which may or may not be integral with the shell 124. The door frame 120 has two pairs of opposing frame members, a vertical pair 130, 132 and a horizontal pair 136, 138. The vertical frame members each have a pair of receivers 150, configured as apertures or slots which are utilized in engaging and latching the door to the container portion. The door may have an active wafer restraining means such as disclosed in U.S. Pat. No. 5,915,562 which is incorporated by reference herein, or a passive means as is well known in the art.

The door may utilize a front cover 160, configured as a panel, which is suitably secured, such as by spring members as disclosed in Ser. No. 08/904,660 which is incorporated herein by reference, and a housing 162 which form an enclosure 164. Two actuation portions configured as manual handles 170, 172 extend through apertures 174, 176 in the front cover. Latch key holes 180, 182 provide robotic access to additional actuation portions configured as key receivers. Latching portions 184, 185 extend and retract through apertures 186, 187 in the door periphery 188.

Figure 5:
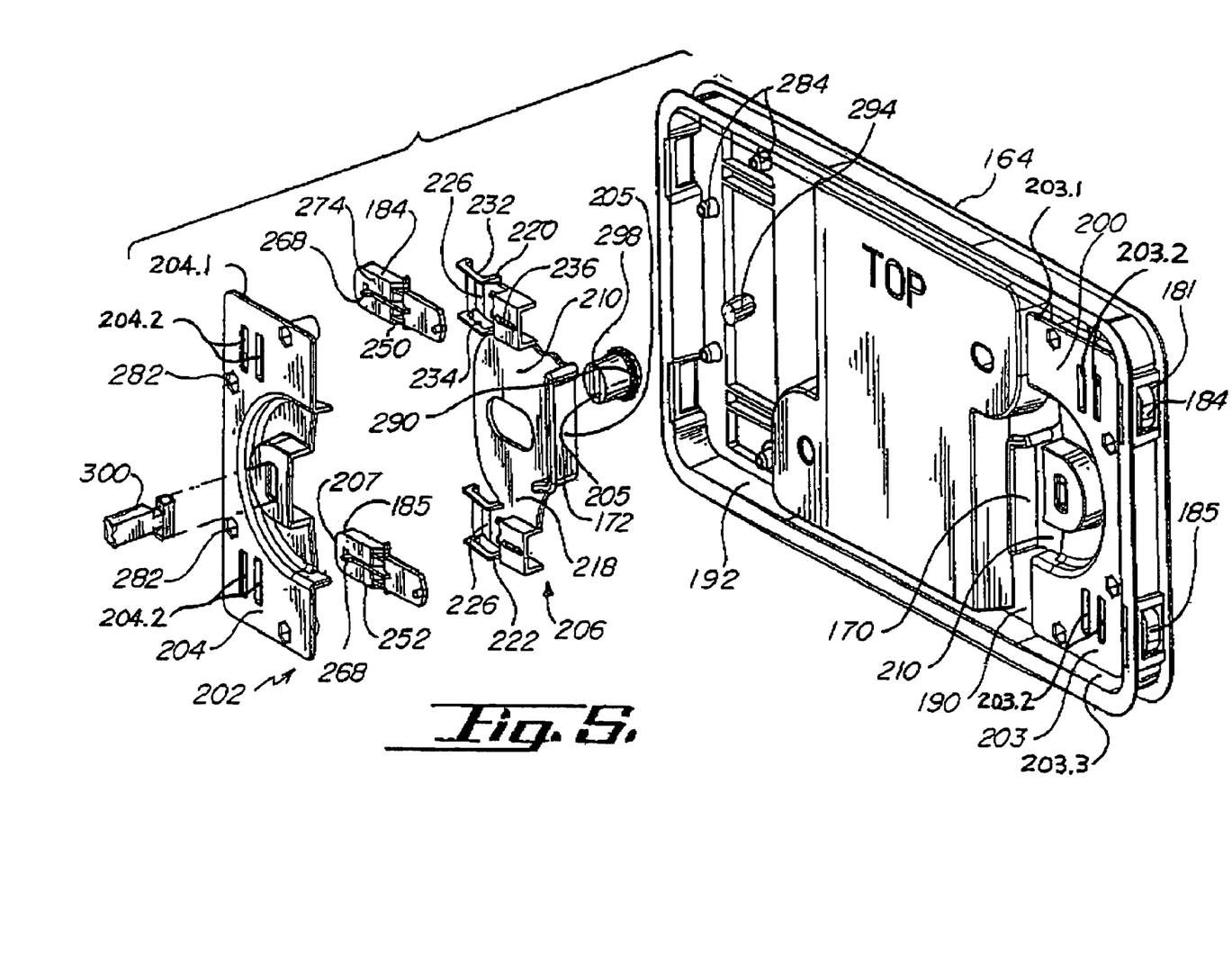
FIG. 5 is an exploded view of the front sides of components of the door of a wafer container in accordance with the invention herein.
Figure 6:
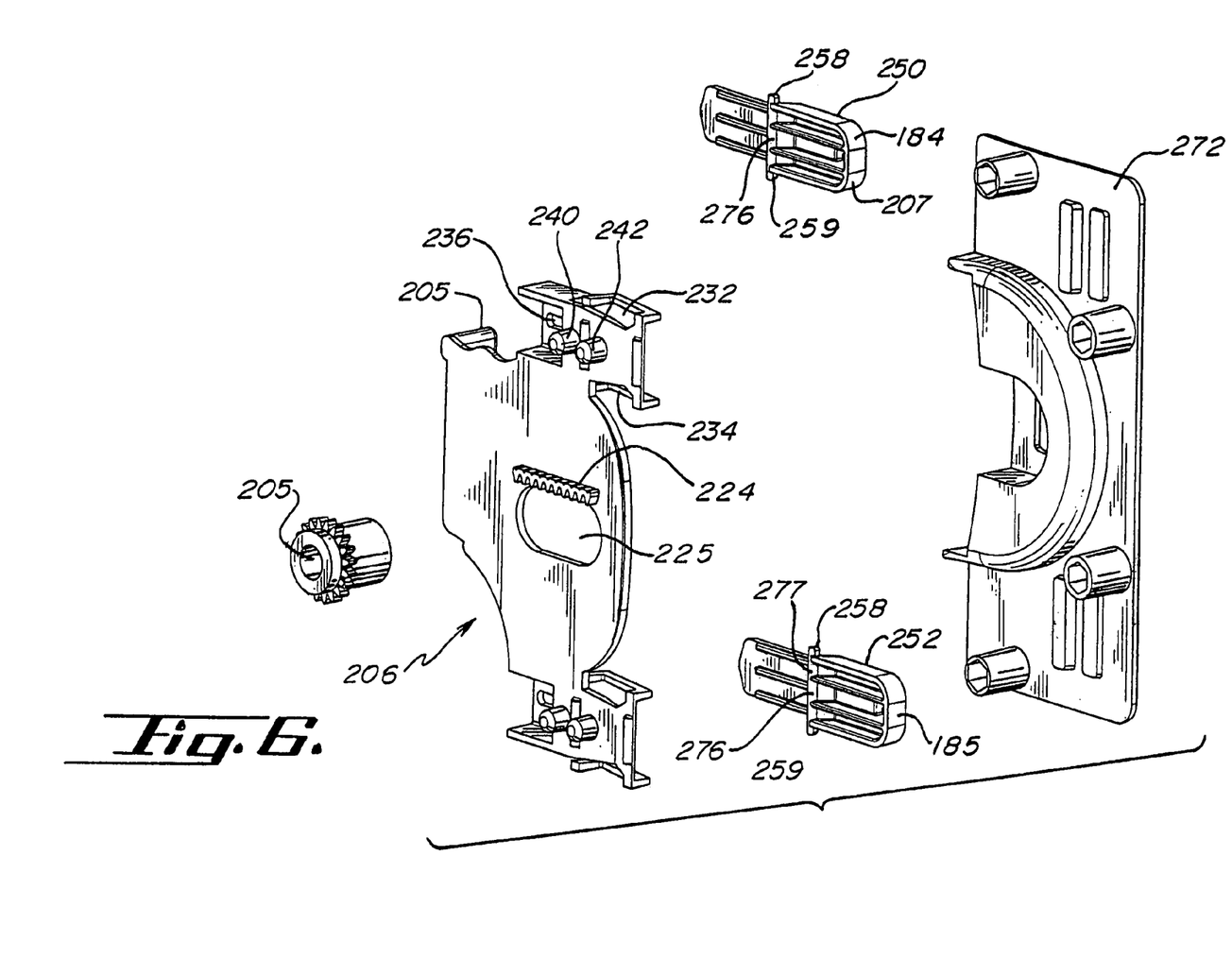
FIG. 6 is an exploded rear view of a latch mechanism in accordance with the invention herein.
Figure 7:
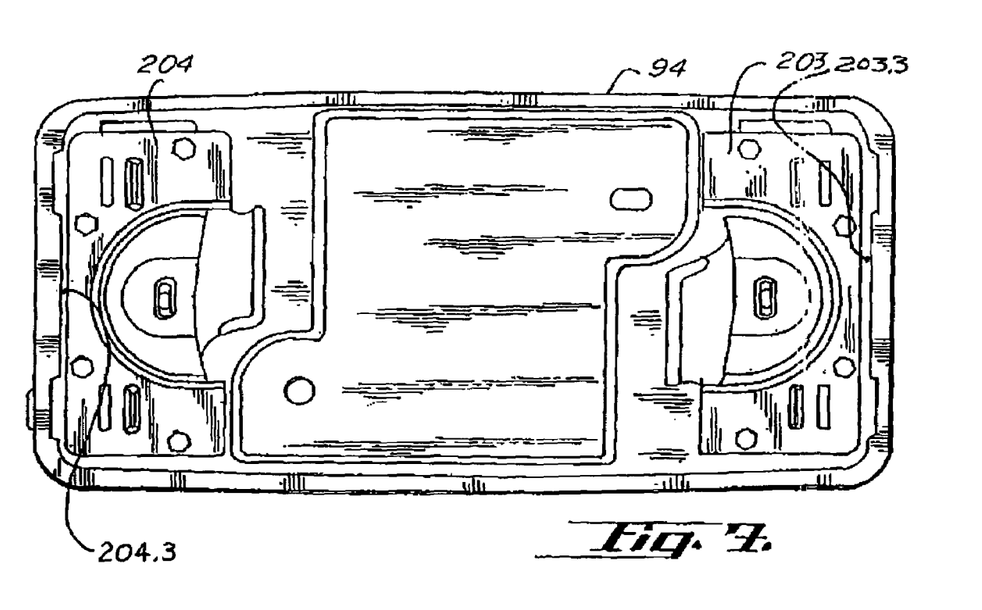
FIG. 7 is an elevational view of a front of an assembled door in accordance with the invention herein.
Figure 8:
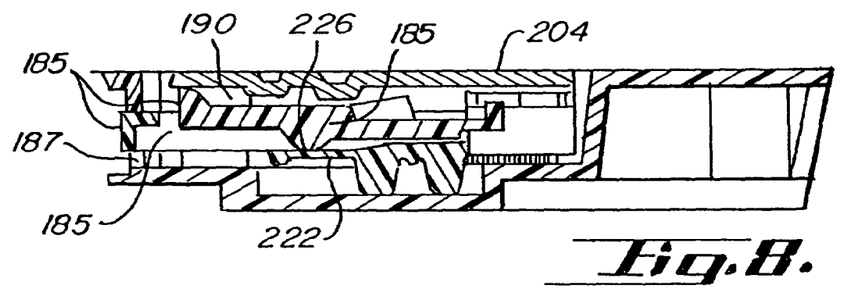
FIG. 8 is a cross sectional view of a latching mechanism with the latching portion retracted in accordance with the invention herein.
Figure 9:
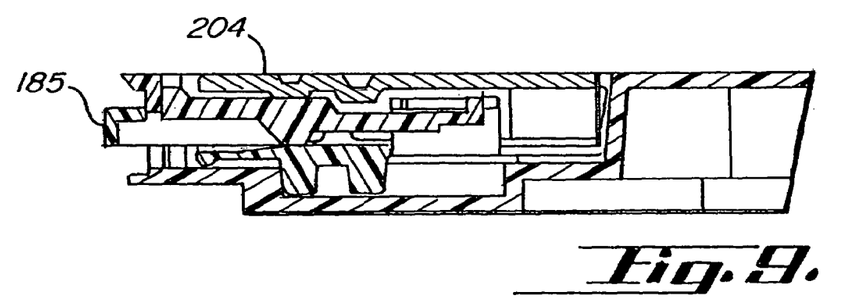
FIG. 9 is a cross sectional view of a latching mechanism with the latching portion extended in accordance with the invention herein.
Figure 10A:
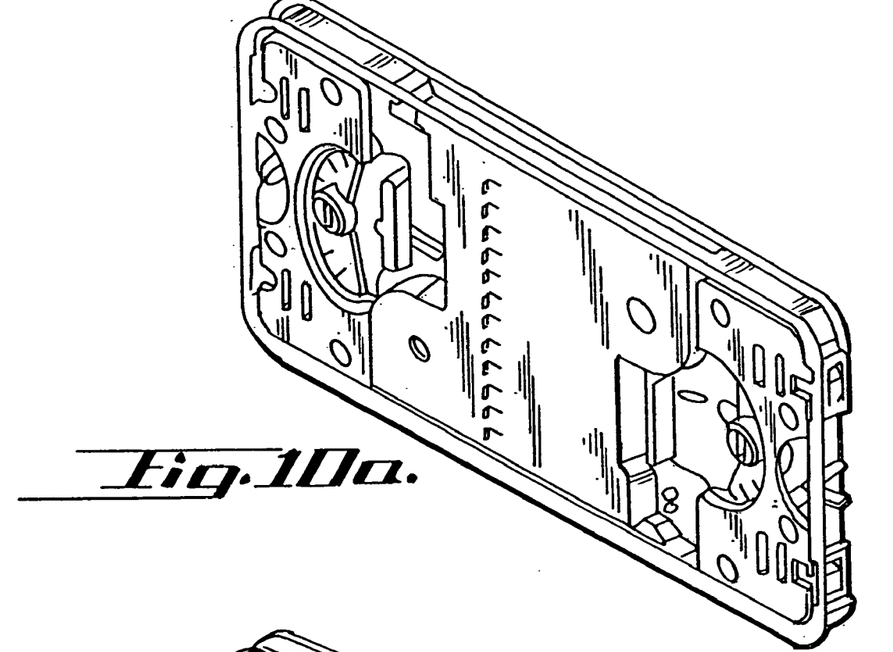
FIGS. 10a and 10b are a perspective views of the front and back or a door of a wafer carrier in accordance with the invention.
Figure 10B:
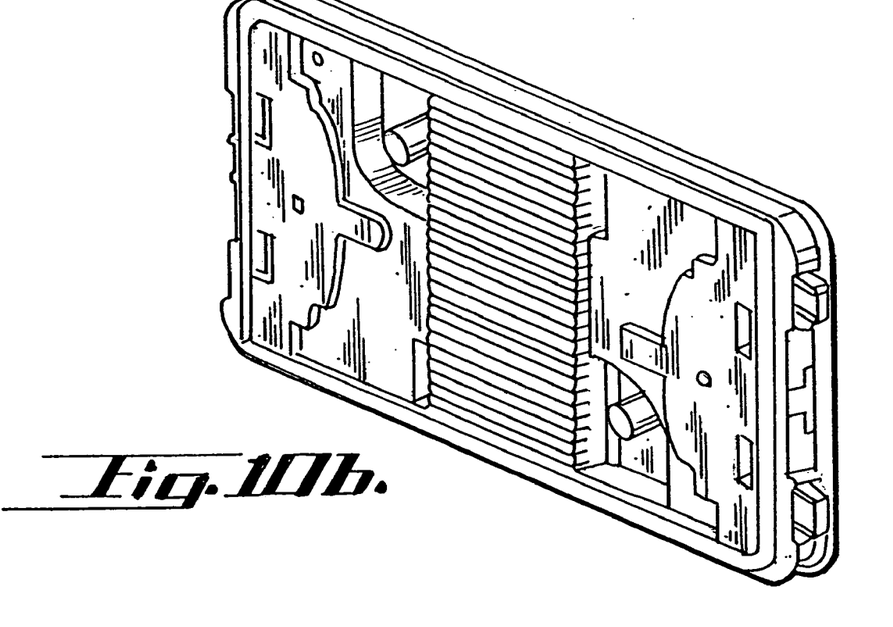

Referring to FIGS. 5, 6, 7, 8 and 9, the door enclosure 164 has two compartments 190, 192 for housing two different mirror image latch mechanisms 200, 202. In this embodiment the door has individual mechanism covers 203, 204, each having a periphery 203.1 and 204.1, respectively. Each cover 203, 204 is equipped with slots 203.2, 204.2. Covers 203 and 204 are sized so that when mounted on door enclosure 164, gaps 203.3, 204.3 form between each cover periphery 203.1, 204.1 and housing 162. The first or left side latch mechanism 202 is in an exploded view with the second or right side latch mechanism 200 assembled. FIG. 6 shows the opposite or inwardly facing view of the exploded left side latch mechanism components. Each latch mechanism has generally a actuation portion 205, a motion translation portion 206, and a latching portion 207.

In the specific embodiment illustrated, each mechanism is comprised of a sliding actuating portion 210 which includes a respective manual handle 170, 172, connecting portion 218, a pair of connecting links configured as a rack 224, and a central aperture 225. The lifting linkages include a cam surface 226 or second lifting portion configured as a ramp, lateral guide slots 232, 234, a central guide slot 236, and spacers 240, 242 configured as posts. The lifting linkages 220, 222 cooperate with latching arms 250, 252 which include the latching portions 184, 185, and guide members 258, 259 configured as guide pins extending from the linkages. The guide pins ride in and are captured by the lateral guide slots 232, 234. The latching arms also have stop members 268 configured as numbs which extend from the front face 274 of the latching arms. The back side of the latching arms have a first lifting portion 276 configured as a cam follower with a ramp engagement surface 277 which engages the second lifting portion on the lifting linkage to provide the inward-outward motion of the latching portion. The cover pieces 203, 204 retain the components in place and may be attached ideally my non-metallic screws at screw holes 282 into post 284.

A gear member 290 configured as a pinion is rotatably seated on a post 294. The gear member engages the rack on the connecting portion 218 to horizontally move same when the pinion is rotated. The gear member has a key receiver configured as a latch key slot 298 for receiving a robotic latch key 300. The key receiver constitutes a first actuation portion and the manual handle constitutes a second actuation portion which both actuate the motion translation portion comprised of the rack and pinion mechanism and the connecting linkages. Alternate motion translation portions may be used and still be within the scope of particular aspects of the invention.

The latch mechanism operates analogously to the latch mechanism of FIGS. 17, 18*a*, 19*a*, 19*b*, 20, 21, of U.S. application Ser. No. 08/891,645, which is incorporated herein by reference, although a rotatable cammed member is not utilized. Rather the sliding handle portion with the attached lifting linkages are utilized to laterally move said linkages. In the 08/891,645 application, the latching are also is engaged with the rotatable cammed member. In the instant case the latching arm is captured by the lifting linkage and the up down motion is controlled and limited by the configuration of structure on the covers 203, 204.

The individual parts of the door mechanism 100 may be suitably formed of carbon fiber polycarbonate to provide a static dissipative characteristic. The front panel and door enclosure may be formed of polycarbonate. The latching components may be formed of suitable plastics such as nylons or PEEK.

What is claimed is:

1. A wafer container comprising:
  a) a container portion for holding a plurality of wafers, the container portion having an open interior and a generally rectangular door frame defining an open front, the door frame having a latch receptacle, the container portion having a plurality of wafer slots that are each capable of receiving one of the wafers for maintaining the plurality of wafers in a horizontal spaced-apart orientation in the container; and
  b) a door placeable in the door frame to cover the open front and thereby seal the open interior, the door having a front and comprising:
    an outer seating portion sized for engaging with the generally rectangular door frame, and
    a latching mechanism comprising:
      a handle exteriorly exposed on the front of the door, said handle laterally moveable,
      a latch portion for extending into and retracting from the latch receptacle, and
      a motion translation portion connecting between the latch portion and the handle for translating lateral motion of the handle into extending and retracting of the latch portion.

2. The wafer carrier of claim 1 wherein the latching mechanism is not within a door enclosure.

3. The wafer carrier of claim 1 wherein the motion translation portion comprises a rack and pinion.

4. The wafer carrier of claim 3 wherein the sliding handle portion is integral with the lifting linkage.

5. The wafer container of claim 1 wherein the door has a left side and a right side, and wherein the latch mechanism is a first latch mechanism and the wafer container further comprises a second latch mechanism and wherein the first latch mechanism is positioned on the left side of the door and the second latch mechanism is positioned on the right side of the door.

6. A wafer container comprising:
a) a container portion for holding a plurality of wafers, the container portion having an open interior and a generally rectangular door frame defining a door opening, the door frame having a latch receptacle, the container portion having a plurality of wafer slots that are each capable of receiving one of the wafers for maintaining the plurality of wafers in a horizontal spaced-apart relationship; and
b) a door comprising a door enclosure with two compartments for receiving a pair of latch mechanisms, and a pair of latching mechanisms in said two compartments, a pair of mechanism covers,
   the door placeable in the door frame to cover the door opening and thereby seal the interior, the door having a front that is opposite the interior when the door is latched to the container portion, each of the latching mechanisms comprising:
   a latch portion for engaging with the latch receptacle,
   a first actuation portion for receiving at least one of manual and robotic actuation, and
   a motion translation portion connecting between the latch portion and the actuation portion for translating actuation of the first actuation portion into engagement of the latch portion with the latch receptacle,
   each of the mechanism covers having a periphery and each of the mechanism covers covering the respective latching mechanism, each mechanism cover having slots therein and a gap between the periphery and the door enclosure providing access for cleaning and drying of said latching mechanisms; and
   wherein the latching mechanism further comprises a second actuation portion, and wherein the second actuation portion is a rotatable latch key receiver and the first actuation portion is a manually operable non-rotatable handle.

7. A wafer container comprising:
a) a container portion for holding a plurality of wafers, the container portion having an open interior and a generally rectangular door frame defining a door opening, the door frame having a latch receptacle, the container portion having a plurality of wafer slots that are each capable of receiving one of the wafers for maintaining the plurality of wafers in a horizontal spaced-apart relationship; and
b) a door comprising a door enclosure with two compartments for receiving a pair of latch mechanisms, and a pair of latching mechanisms in said two compartments, a pair of mechanism covers,
   the door placeable in the door frame to cover the door opening and thereby seal the interior, the door having a front that is opposite the interior when the door is latched to the container portion, each of the latching mechanisms comprising:
   a latch portion for engaging with the latch receptacle,
   a first actuation portion for receiving at least one of manual and robotic actuation, and
   a motion translation portion comprising a rack and pinion mechanism connecting between the latch portion and the actuation portion for translating actuation of the first actuation portion into engagement of the latch portion with the latch receptacle,
   each of the mechanism covers having a periphery and each of the mechanism covers covering the respective latching mechanism, each mechanism cover having slots therein and a gap between the periphery and the door enclosure providing access for cleaning and drying of said latching mechanisms.

8. A wafer container comprising:
a) a container portion for holding a plurality of wafers, the container portion having an open interior and a generally rectangular door frame defining a door opening, the door frame having a latch receptacle, the container portion having a plurality of wafer slots that are each capable of receiving one of the wafers for maintaining the plurality of wafers in a horizontal spaced-apart relationship; and
b) a door comprising a door enclosure with two compartments for receiving a pair of latch mechanisms, and a pair of latching mechanisms in said two compartments, a pair of mechanism covers,
the door placeable in the door frame to cover the door opening and thereby seal the interior, the door having a front that is opposite the interior when the door is latched to the container portion, each of the latching mechanisms comprising:
   a latch portion for engaging with the latch receptacle,
   a first actuation portion for receiving at least one of manual and robotic actuation, and
   a motion translation portion connecting between the latch portion and the actuation portion for translating actuation of the first actuation portion into engagement of the latch portion with the latch receptacle,
   each of the mechanism covers having a periphery and each of the mechanism covers covering the respective latching mechanism, each mechanism cover having slots therein and a gap between the periphery and the door enclosure providing access for cleaning and drying of said latching mechanisms; and
wherein the latching mechanism comprises:
   a latch arm with two ends, one end having a cam follower engaged to the first cam guide and the other end having a latch portion extending to the opening in the outer seating portion, the lifting linkage having a first lifting portion intermediate the two ends, the first cam guide configured to extend the latch portion outwardly with respect to the door in a first direction into the latch receptacle; and
   a lifting linkage connected to the sliding handle portion and laterally moveable therewith, the lifting linkage having a cooperating second lifting portion engageable with said first lifting portion, the first lifting portion and the second lifting portion arranged in an overlapping relationship, one of said first lifting portion and said second lifting portion having a ramp and the other of said first lifting portion and said second lifting portion have a ramp engagement surface, the second cam guide configured to move the lifting linkage with respect to the latch linkage whereby the ramp engagement portion rides on the ramp to move the latch linkage in a second direction substantially normal to the first direction when the latching portion is in the latch receptacle.

9. A wafer container comprising:
a) a container portion for holding wafers, the container portion having an open interior and a generally rectangular door frame defining a door opening, the door frame having a latch receptacle;
b) a door placeable in the door frame to cover the door opening, the door comprising:
an outer seating portion sized for engaging with the generally rectangular door frame,
a latching mechanism comprising:
a actuation portion for receiving external actuation, the actuation portion exteriorly accessible and rotatable,
a latch portion for engagement with the latch receptacle,
a pinion connected to the actuation portion, and
a rack engaged with the pinion and connecting to the latch portion, whereby rotation of the actuation portion moves the latch portion.

10. The wafer container of claim 9 wherein the door has a front and the latch mechanism is exposed on the front of the door.

11. The wafer container of claim 9 wherein the actuation portion is a first actuation portion and wherein the latch mechanism further comprises a second actuation portion that is constrained to move laterally, the second actuation portion connecting to the rack, whereby the latch mechanism may be actuated by either rotating the first actuation mechanism or by laterally moving the second actuation member.

12. The wafer container of claim 11 wherein the door has a front and the latch mechanism is exposed on the front.

13. The wafer container of claim 9 wherein the door has a front, a left side and a right side, and wherein the latch mechanism is a first latch mechanism and the wafer container further comprises a second latch mechanism and wherein the first latch mechanism is positioned on the left side of the door and the second latch mechanism is positioned on the right side of the door.

14. A wafer container comprising:
a) a container portion for holding a plurality of wafers, the container portion having an open interior and a generally rectangular door frame defining a forward facing door opening, the door frame having a latch receptacle, the container portion having a plurality of wafer slots that are each capable of receiving one of the wafers for maintaining the plurality of wafers in a spaced-apart vertically stacked relationship; and
b) a door placeable in the door frame to cover the door opening and thereby sealingly close the open interior, the door having a front and an outer seating portion sized for engaging with the generally rectangular door frame, the door having a latching mechanism comprising:
a latch portion for engaging with the latch receptacle,
a first rotatable actuation portion on the front of the door for receiving robotic actuation with a key,
a second laterally moveable actuation portion on the front of the door for manual actuation, and
a motion translation portion connecting between the latch portion and the first rotatable actuation portion and between the latch portion and the second laterally moveable actuation portion for translating actuation of said actuation portions into engagement of the latch portion with the latch receptacle.

15. The wafer carrier of claim 14 wherein the motion translation portion comprises a rack and pinion.

16. The wafer carrier of claim 14 wherein the latch mechanism is substantially exposed at said front providing access for cleaning and drying said mechanism.

17. The wafer carrier of claim 14 wherein the latching mechanism is a first latching mechanism and the wafer carrier further comprises a second latching mechanism that is substantially a mirror image of the first latching mechanism.

18. The wafer carrier of claim 14 wherein the motion translation portion provides a laterally outward motion to the latching portion and a motion in a forward direction.

19. A wafer container comprising:
a) a container portion for holding wafers, the container portion having an open interior and a generally rectangular door frame defining a door opening, the door frame having a latch receptacle;
b) a door placeable in the door frame to cover the door opening, the door having an open interior and comprising:
i) an outer seating portion sized for engaging with the generally rectangular door frame, the outer seating portion having a opening corresponding to the latch receptacle when the door is placed in the door frame;
ii) a sliding handle portion constrained and laterally moveable within the enclosure, said portion including a handle exteriorly exposed on the front of the door;
iii) a latch arm with two ends, one end having a cam follower engaged to the first cam guide and the other end having a latch portion extending to the opening in the outer seating portion, the lifting linkage having a first lifting portion intermediate the two ends, the first cam guide configured to extend the latch portion outwardly with respect to the door in a first direction into the latch receptacle; and
iv) a lifting linkage connected to the sliding handle portion and laterally moveable therewith, the lifting linkage having a cooperating second lifting portion engageable with said first lifting portion, the fist lifting portion and the second lifting portion arranged in an overlapping relationship, one of said first lifting portion and said second lifting portion having a ramp and the other of said first lifting portion and said second lifting portion have a ramp engagement surface, the second cam guide configured to move the lifting linkage with respect to the latch linkage whereby the ramp engagement portion rides on the ramp to move the latch linkage in a second direction substantially normal to the first direction when the latching portion is in the latch receptacle.

20. The wafer carrier of claim 19 further comprising a rack and pinion gear system connected to the sliding handle portion, the pinion accessible from exterior of the door whereby the door can be robotically operated by engagement with said pinion.

21. A wafer carrier comprising:
a) a container portion for holding wafers in a horizontal arrangement, the container portion having a open front and a latch receptacle on the container portion at the open front; and
b) a door placeable to close the open front, the door comprising;

i) a latching arm having a latching portion extendable outwardly in a first direction towards the latch receptacle; and ii) a lifting linkage adjacent the latch linkage and moveable in a direction substantially parallel to the first direction, at least one of the lifting linkage and the latching arm having a ramp such that when the other of the lifting linkage and the latching portion moves with respect to the ramp, the ramp causes the latching linkage to be moved in a second direction substantially normal to the first direction;

iii) a sliding handle portion constrained and laterally moveable within the enclosure, said portion including a handle exteriorly exposed on the front of the door and a connecting portion connecting the handle to the lifting linkage, whereby the door may be operated by moving the exteriorly exposed handle, the handle portion further comprising g a linear gear fixed thereto; and iv) a rotatable circular gear within the door enclosure engaged with the linear gear, the circular gear accessible from the front exterior of the door whereby the door may be robotically operated.

* * * * *